(12) United States Patent
Nishikawa et al.

(10) Patent No.: US 12,724,086 B2
(45) Date of Patent: Sep. 1, 2026

(54) BATTERY ABNORMALITY DETECTION SYSTEM, BATTERY ABNORMALITY DETECTION METHOD, AND BATTERY ABNORMALITY DETECTION PROGRAM

(71) Applicant: Panasonic Intellectual Property Management Co., Ltd., Osaka (JP)

(72) Inventors: Shinya Nishikawa, Osaka (JP); Yusuke Itakura, Nara (JP); Mutsuhiko Takeda, Kyoto (JP); Takashi Iida, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 221 days.

(21) Appl. No.: 18/711,877

(22) PCT Filed: Nov. 1, 2022

(86) PCT No.: PCT/JP2022/040879
§ 371 (c)(1),
(2) Date: May 21, 2024

(87) PCT Pub. No.: WO2023/100582
PCT Pub. Date: Jun. 8, 2023

(65) Prior Publication Data

US 2025/0020731 A1 Jan. 16, 2025

(30) Foreign Application Priority Data

Nov. 30, 2021 (JP) ................................ 2021-193978

(51) Int. Cl.
*G01R 31/396* (2019.01)
*G01K 1/02* (2021.01)
(Continued)

(52) U.S. Cl.
CPC .......... *G01R 31/396* (2019.01); *G01K 1/026* (2013.01); *G01K 3/14* (2013.01); *G01R 31/3835* (2019.01); *G01R 31/52* (2020.01)

(58) Field of Classification Search
CPC .. G01R 31/396; G01R 31/3835; G01R 31/52; G01R 31/389; G01R 31/36;
(Continued)

(56) References Cited

U.S. PATENT DOCUMENTS 10,862,319 B2 * 12/2020 Lai ........................ H01M 10/48
11,262,412 B2 * 3/2022 Harper ................ H01M 10/482
(Continued)

FOREIGN PATENT DOCUMENTS

JP 2008-204867 9/2008
JP 2012-052857 3/2012

OTHER PUBLICATIONS

International Search Report of PCT application No. PCT/JP2022/040879 dated Jan. 24, 2023.
(Continued)

*Primary Examiner* — Giovanni Astacio-Oquendo
(74) *Attorney, Agent, or Firm* — Rimon P.C.

(57) ABSTRACT

A battery abnormality detection system includes the following constituents. A battery data acquisition unit acquires voltages of one of a plurality of cells and a plurality of parallel cell blocks in a battery pack and temperatures at a plurality of observation points respectively measured by a plurality of temperature sensors provided in the battery pack. A determination unit determines presence or absence of an abnormality in one of a specific cell and a specific parallel cell block, based on a transition of a voltage of the one of the specific cell and the specific parallel cell block in a predetermined period in the battery pack and on a difference between a temperature change at a first observation
(Continued)

point and a temperature change at a second observation point in the predetermined period in the battery pack.

6 Claims, 6 Drawing Sheets

(51) Int. Cl.
*G01K 3/14* (2006.01)
*G01R 31/3835* (2019.01)
*G01R 31/52* (2020.01)

(58) Field of Classification Search
CPC ........ G01R 31/392; G01K 1/026; G01K 3/14; H01M 10/425; H01M 10/482; H01M 10/486; H02J 7/62; H02J 7/65; H02J 7/663; Y02E 60/10
See application file for complete search history.

(56) References Cited

U.S. PATENT DOCUMENTS

| | | | | |
|---|---|---|---|---|
| 12,111,362 | B2 * | 10/2024 | Chiba | G01R 31/374 |
| 12,531,285 | B2 * | 1/2026 | Taguchi | G01R 31/392 |
| 2019/0181663 | A1 | 6/2019 | Nishikawa et al. | |
| 2021/0288356 | A1 * | 9/2021 | Tsutsui | H01M 10/445 |
| 2023/0408591 | A1 * | 12/2023 | Ko | G01R 31/392 |
| 2025/0027984 | A1 * | 1/2025 | Choi | G01R 31/14 |
| 2025/0279488 | A1 * | 9/2025 | Sim | H01M 10/425 |

OTHER PUBLICATIONS

The EPC Office Action dated May 21, 2025 for the related European Patent Application No. 22901015.2.

* cited by examiner

CC
CV
0
Current [A]
−100
40
Temperature [°C]
30
20
Maximum temperature in battery pack
Minimum temperature in battery pack

BATTERY ABNORMALITY DETECTION SYSTEM, BATTERY ABNORMALITY DETECTION METHOD, AND BATTERY ABNORMALITY DETECTION PROGRAM

TECHNICAL FIELD

The present disclosure relates to a battery abnormality detection system, a battery abnormality detection method, and a battery abnormality detection program for detecting abnormality of a battery.

BACKGROUND ART

When a secondary battery is charged, measures against thermal runaway due to self-heating or the like are required. For example, a method has been proposed in which a battery temperature is detected at predetermined time intervals, whether or not an anomaly temperature rise occurs is determined on the basis of a temperature difference or a temperature rise rate, and charging is interrupted in a case where an anomaly temperature rise occurs (See, for example, PTL 1).

CITATION LIST

Patent Literature

PTL 1: Unexamined Japanese Patent Publication No. 2008-204867

SUMMARY OF THE INVENTION

The above method obtains the temperature difference or the temperature rise rate at a timing set from start of charging, and determines whether there is an abnormality. In addition, an allowable range of temperature change is determined on the assumption of a normal charging pattern. Therefore, in a case where the temperature change at the time of charging does not greatly increase beyond the assumption, it is not determined as abnormal basically. When charging is performed in a pattern different from the normal pattern, it is difficult to determine abnormality because the pattern of temperature change is different from a normal pattern.

On the other hand, a method of detecting anomaly heat generation from a relationship between a calorific value based on a charging current in a predetermined period and a calorific value of a battery based on a rise temperature of the battery in the predetermined period is conceivable.

In this method, it is not possible to distinguish whether the temperature rise of the battery is caused by an influence of an external factor (for example, heat generation and solar radiation of an external load) or by an abnormality of the battery itself such as an internal short-circuit, and when the influence of the external factor is large, the detection accuracy may decrease.

The present disclosure has been made in view of the above circumstance, and it is therefore an object of the present disclosure to provide a technique for detecting an abnormality of a battery with high accuracy.

In order to solve the above problem, a battery abnormality detection system according to an aspect of the present disclosure includes: an acquisition unit that acquires voltages of one of a plurality of cells and a plurality of parallel cell blocks in a battery pack and temperatures at a plurality of observation points respectively measured by a plurality of temperature sensors provided in the battery pack; and a determination unit that determines presence or absence of an abnormality in one of a specific cell and a specific parallel cell block, based on a transition of a voltage of the one of the specific cell and the specific parallel cell block in a predetermined period in the battery pack and on a difference between a temperature change at a first observation point and a temperature change at a second observation point in the predetermined period in the battery pack.

Any combinations of the configuration elements described above and expressions of the present disclosure that are converted in terms of devices, systems, methods, computer programs, and the like are also effective as aspects of the present disclosure.

According to the present disclosure, an abnormality of a battery can be detected with high accuracy.

DESCRIPTION OF EMBODIMENT

Figure 1:
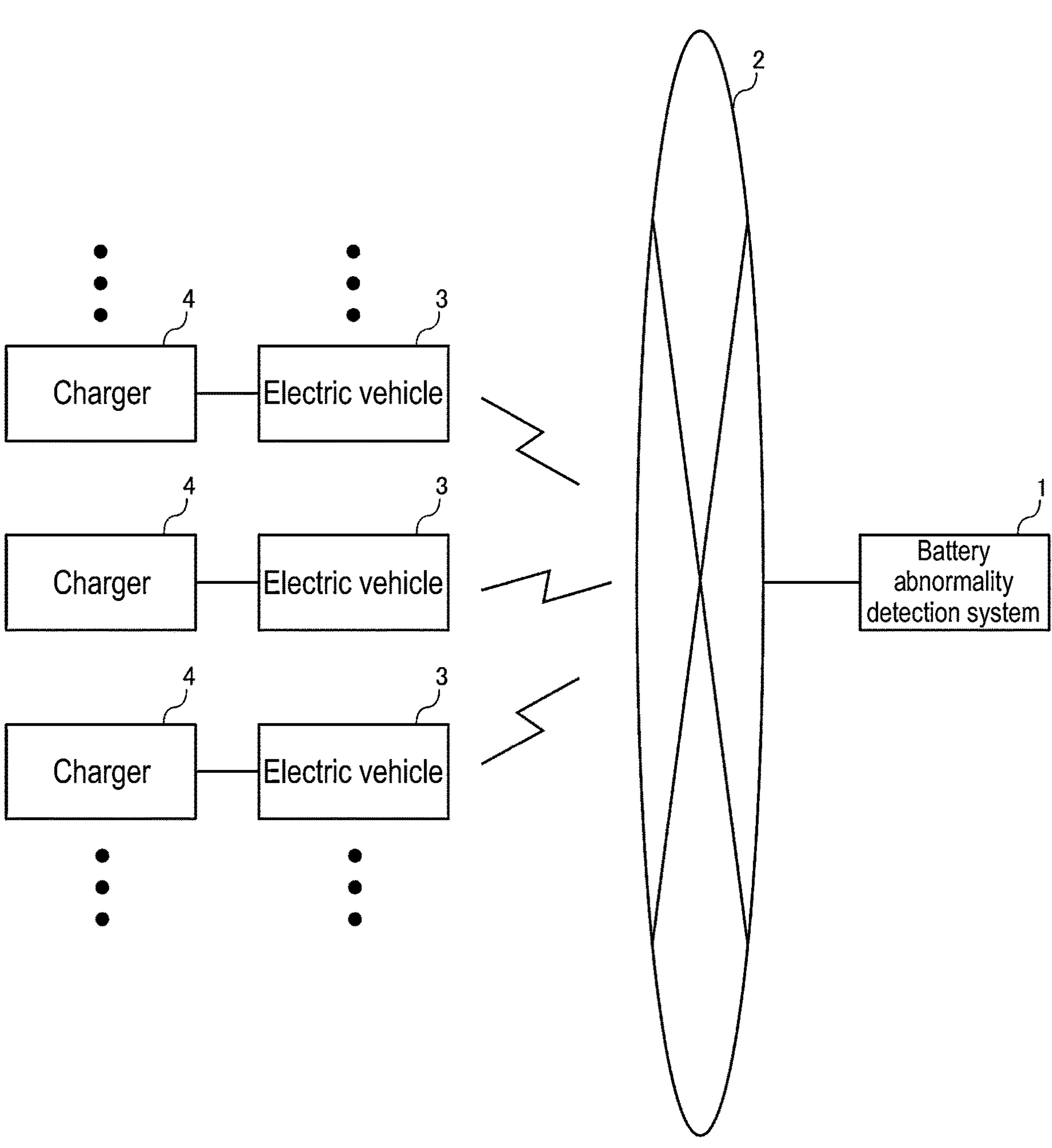
FIG. 1 is a diagram for explaining an outline of a battery abnormality detection system according to an exemplary embodiment.

FIG. 1 is a diagram for explaining an outline of battery abnormality detection system 1 according to an exemplary embodiment. Battery abnormality detection system 1 according to the exemplary embodiment is a system for detecting an abnormality of a cell included in a battery pack mounted on electric vehicle 3. Examples of electric vehicle 3 include an electric vehicle (EV), a plug-in hybrid vehicle (PHV), and a hybrid vehicle (HV), but in the exemplary embodiment, a pure electric vehicle (EV) is assumed.

Battery abnormality detection system 1 according to the exemplary embodiment is a system used by at least one delivery company. For example, battery abnormality detection system 1 may be constructed on an own server installed in an own facility or a data center of a service providing entity that provides an operation management support service for electric vehicle 3. In addition, battery abnormality detection system 1 may be constructed on a cloud server used on the basis of a cloud service contract. Battery abnormality detection system 1 may be constructed on a plurality of servers dispersedly installed in a plurality of bases (data center, own facility). The plurality of servers may be a combination of a plurality of own servers, a combination of a plurality of cloud servers, or a combination of own servers and cloud servers.

The delivery company has a plurality of electric vehicles 3 and a plurality of chargers 4, and uses the plurality of electric vehicles 3 in delivery business. Electric vehicles 3 can also be charged from charger 4 other than chargers 4 installed at the delivery base.

The plurality of electric vehicles 3 each have a wireless communication function, and are accessible to network 2 to which battery abnormality detection system 1 is connected. Electric vehicles 3 can transmit battery data of a battery pack mounted thereon to battery abnormality detection system 1 via network 2.

Network 2 is a general term for communication paths such as the Internet, a dedicated line, and a virtual private network (VPN), and a communication medium and a protocol thereof are not limited. As the communication media, for example, a mobile phone network (cellular network), a wireless local area network (LAN), a wired LAN, an optical fiber network, an ADSL network, a CATV network, or the like can be used. As the communication protocols, for example, the transmission control protocol (TCP)/internet protocol (IP), the user datagram protocol (UDP)/IP, Ethernet (registered trademark), or the like can be used.

Figure 2:
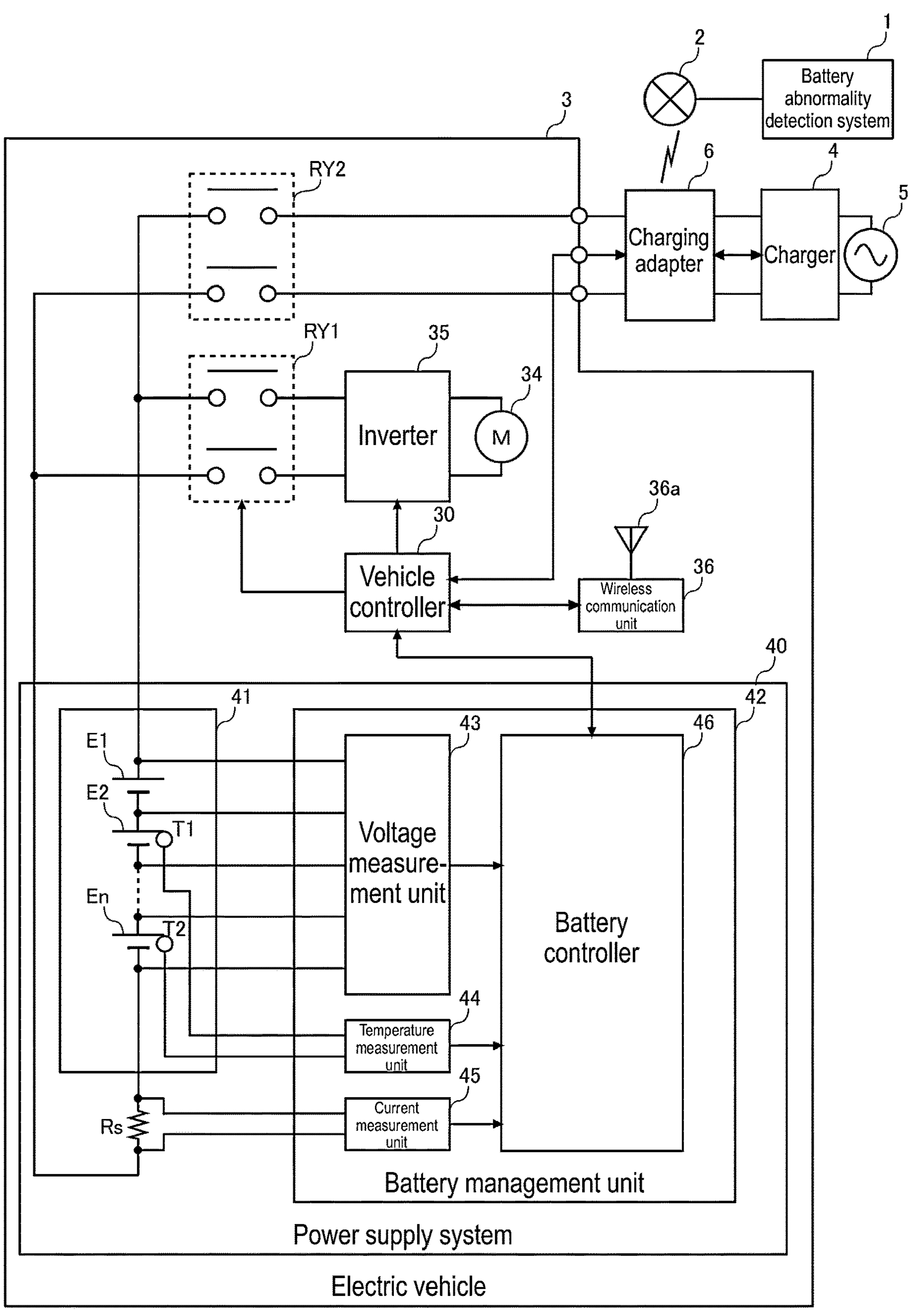
FIG. 2 is a diagram for explaining a detailed configuration of a power supply system mounted on an electric vehicle.

FIG. 2 is a diagram for explaining a detailed configuration of power supply system 40 mounted on electric vehicle 3. Power supply system 40 is connected to motor 34 via first relay RY1 and inverter 35. At the time of power running, inverter 35 converts DC power supplied from power supply system 40 into AC power and supplies the AC power to motor 34. At the time of regeneration, inverter 35 converts AC power supplied from motor 34 into DC power and supplies the DC power to power supply system 40. Motor 34 is a three-phase AC motor, and rotates in accordance with the AC power supplied from inverter 35 at the time of power running. At the time of regeneration, rotational energy due to deceleration is converted into AC power and supplied to inverter 35.

Vehicle controller 30 is a vehicle electronic control unit (ECU) that controls entire electric vehicle 3, and may be configured by, for example, an integrated vehicle control module (VCM). Wireless communication unit 36 includes a modem and performs wireless signal processing for wirelessly connecting to network 2 via antenna 36*a*. As a wireless communication network to which electric vehicle 3 can be wirelessly connected, for example, a cellular phone network (cellular network), a wireless LAN, vehicle-to-infrastructure (V2I), vehicle-to-vehicle (V2V), an electronic toll collection system (ETC system), and dedicated short range communications (DSRC) can be used.

First relay RY1 is a contactor inserted in wiring connecting between power supply system 40 and inverter 35. At the time of running, vehicle controller 30 controls first relay RY1 to an on state (closed state) and electrically connects power supply system 40 with a power system of electric vehicle 3. At the time of not running, vehicle controller 30 controls first relay RY1 to an off state (open state) in principle, and electrically interrupts power supply system 40 and the power system of electric vehicle 3. Instead of the relay, another type of switch such as a semiconductor switch may be used.

By connecting electric vehicle 3 to charger 4, battery pack 41 in power supply system 40 can be charged from the outside. In the present exemplary embodiment, electric vehicle 3 is connected to charger 4 via charging adapter 6. Charging adapter 6 is attached to, for example, a tip of a terminal of charger 4. When charging adapter 6 is attached to charger 4, a controller in charging adapter 6 establishes a communication channel with a controller in charger 4.

Charging adapter 6 is preferably configured by a small housing. In this case, a driver of electric vehicle 3 can easily carry charging adapter 6, and can use charger 4 other than charger 4 installed at the delivery base by attaching charging adapter 6. For example, as charger 4 other than charger 4 installed at the delivery base, charger 4 installed in a public facility, a commercial facility, a gas station, a car dealer, or a service area of an expressway can be used by attaching charging adapter 6.

When charging adapter 6 attached to charger 4 and electric vehicle 3 are connected by a charging cable, battery pack 41 in electric vehicle 3 can be charged from charger 4. Charging adapter 6 causes the electric power supplied from charger 4 to pass through electric vehicle 3. Charging adapter 6 has a wireless communication function, and can exchange data with battery abnormality detection system 1 via network 2. Charging adapter 6 functions as a gateway that relays communication between electric vehicle 3 and charger 4, between electric vehicle 3 and battery abnormality detection system 1, and between charger 4 and battery abnormality detection system 1.

Charger 4 is connected to commercial power system 5 and charges battery pack 41 in electric vehicle 3. In electric vehicle 3, second relay RY2 is inserted into wiring connecting power supply system 40 and charger 4. Instead of the relay, another type of switch such as a semiconductor switch may be used. Battery management unit 42 controls second relay RY2 to be turned on via vehicle controller 30 or directly before the charging starts, and controls second relay RY2 to be turned off after the charging ends.

In general, AC is used for normal charging, and DC is used for quick charging. When the charging is performed by AC (for example, single-phase 100/200 V), AC power is converted to DC power by an AC/DC converter (not illustrated) provided between second relay RY2 and battery pack 41. When the charging is performed by DC, charger 4 generates DC power by performing full-wave rectifying of AC power supplied from commercial power system 5, and by smoothing the rectified AC power by a filter.

Usable quick charging standards include, for example, CHAdeMO (registered trademark), ChaoJi, and GB/T, and combined charging system (Combo). CHAdeMO 2.0 defines maximum power output (specification) as 1000 V×400 A=400 kW. CHAdeMO 3.0 defines maximum power output (specification) as 1500 V×600 A=900 kW. ChaoJi defines maximum power output (specification) as 1500 V×600 A=900 kW. GB/T defines maximum power output (specification) as 750 V×250 A=185 kW. Combo defines maximum power output (specification) as 900 V×400 A=350 kW. CHAdeMO, ChaoJi, and GB/T adopt a controller area network (CAN) as a standard communication method. Combo, on the other hand, adopts power line communication (PLC) as a standard communication method.

The charging cable conforming to the CAN method includes a communication line as well as a power line. When electric vehicle 3 and charging adapter 6 are connected by the charging cable, vehicle controller 30 establishes a communication channel with a control unit in charging adapter 6. The charging cable adopting the PLC method transmits a communication signal by being superimposed on a power line.

Vehicle controller 30 establishes a communication channel with battery management unit 42 via an in-vehicle network (for example, CAN or LIN (Local Interconnect Network)). When the communication standard between vehicle controller 30 and the control unit in charging adapter 6 is different from the communication standard between vehicle controller 30 and battery management unit 42, vehicle controller 30 has a gateway function.

Power supply system 40 mounted on electric vehicle 3 includes battery pack 41 and battery management unit 42. Battery pack 41 includes a plurality of cells. FIG. 2 illustrates a configuration example in which a plurality of cells E1 to En are connected in series. A plurality of parallel cell blocks configured by connecting a plurality of cells in parallel may be connected in series (see FIG. 6 described later). As the cell, a lithium ion battery cell, a nickel metal hydride battery cell, a lead battery cell, or the like can be used. Hereinafter, the present description assumes an example of use of lithium ion battery cells (nominal voltage: 3.6 V to 3.7 V). The number of series of cells E1 to En or the parallel cell blocks is determined according to a drive voltage of motor 34.

Shunt resistor Rs is connected in series with the plurality of cells E1 to En or the plurality of parallel cell blocks. Shunt resistor Rs functions as a current detection element. A Hall element may be used instead of shunt resistor Rs. A plurality of temperature sensors T1 and T2 for detecting temperatures of the plurality of cells E1 to En or the plurality of parallel cell blocks are provided in battery pack 41. For example, a thermistor can be used for temperature sensors T1, T2. One temperature sensor may be provided for 6 to 8 cells or parallel cell blocks, for example.

Battery management unit 42 includes voltage measurement unit 43, temperature measurement unit 44, current measurement unit 45, and battery controller 46. Nodes of the plurality of cells E1 to En or the plurality of parallel cell blocks connected in series and voltage measurement unit 43 are connected by a plurality of voltage lines. Voltage measurement unit 43 measures voltage of each of cells E1 to En or the parallel cell blocks by measuring a voltage between each two adjacent voltage lines. Voltage measurement unit 43 transmits the measured voltage of each of cells E1 to En or the parallel cell blocks to battery controller 46.

Since voltage measurement unit 43 is high in voltage with respect to battery controller 46, voltage measurement unit 43 and battery controller 46 are connected via a communication line in an insulated state. Voltage measurement unit 43 can include an application specific integrated circuit (ASIC) or general-purpose analog front-end IC. Voltage measurement unit 43 includes a multiplexer and an A/D converter. The multiplexer outputs voltages between two adjacent voltage lines to the A/D converter in order from the top. The A/D converter converts, into a digital value, an analog voltage to be input from the multiplexer.

Temperature measurement unit 44 includes a voltage dividing resistor and an A/D converter. The A/D converter sequentially converts, into digital values, a plurality of analog voltages divided by the plurality of temperature sensors T1 and T2 and a plurality of the voltage dividing resistors, and outputs the digital values to battery controller 46. Battery controller 46 measures temperatures at a plurality of observation points in battery pack 41.

Current measurement unit 45 includes a differential amplifier and an A/D converter. The differential amplifier amplifies a voltage across shunt resistor Rs and outputs the amplified voltage to the A/D converter. The A/D converter converts an analog voltage input from the differential amplifier into a digital value and outputs the digital value to battery controller 46. Battery controller 46 measures a current flowing through the plurality of cells E1 to En or the plurality of parallel cell blocks based on the digital value.

When an A/D converter is mounted in battery controller 46 and an analog input port is provided in battery controller 46, temperature measurement unit 44 and current measurement unit 45 may output analog voltages to battery controller 46, and the A/D converter in battery controller 46 may convert the analog voltages into digital values.

Battery controller 46 manages states of the plurality of cells E1 to En or the plurality of parallel cell blocks based on the voltages, temperatures, and currents of the plurality of cells E1 to En or the plurality of parallel cell blocks measured by voltage measurement unit 43, temperature measurement unit 44, and current measurement unit 45. When an overvoltage, an undervoltage, an overcurrent, or a temperature anomaly occurs in at least one of the plurality of cells E1 to En or the plurality of parallel cell blocks, battery controller 46 turns off second relay RY2 or a protective relay (not illustrated) in battery pack 41 to protect the cell.

Battery controller 46 can be configured by a microcontroller and a nonvolatile memory (for example, an electrically erasable programmable read-only memory (EEPROM) or a flash memory). Battery controller 46 estimates an SOC, a full charge capacity (FCC), and a state of health (SOH) of each of the plurality of cells.

Battery controller 46 estimates the SOC by a combination of an open circuit voltage (OCV) method and a current integration method. The OCV method is a method of estimating the SOC based on the OCV of each cell measured by voltage measurement unit 43 and the SOC-OCV curve of the cell. The SOC-OCV curve of the cell is created in advance based on a characteristic test by a battery manufacturer, and is registered in an internal memory of the microcontroller at the time of shipment.

The current integration method is a method of estimating SOC based on the OCV at the start of charging and discharging of each cell and an integrated value of the current measured by current measurement unit 45. In the current integration method, a measurement error of current measurement unit 45 accumulates as the charging and discharging time becomes longer. Therefore, it is preferable to correct the SOC estimated by the current integration method using the SOC estimated by the OCV method.

Battery controller 46 can estimate FCC by dividing the integrated current value from the start to the end of charging and discharging by the change in SOC during the period. The SOC at the start of charging and discharging and the SOC at the end of charging and discharging can be obtained from the measured OCV and SOC-OCV curves, respectively.

The SOH is defined by a ratio of a current full charge capacity (FCC) to an initial FCC, and a lower numerical value (closer to 0%) indicates that degradation has progressed.

Battery controller 46 transmits battery data including the voltage, the current, the SOC, the FCC, and the SOH of each cell, and the temperatures of the plurality of observation points in battery pack 41 to vehicle controller 30 via the in-vehicle network. Battery controller 46 may use two of the maximum temperature and the minimum temperature among the plurality of temperatures detected by the plurality of temperature sensors provided in battery pack 41 as the temperatures of the plurality of observation points.

Vehicle controller 30 can transmit the battery data to battery abnormality detection system 1 in real time using wireless communication unit 36 while electric vehicle 3 is traveling. Vehicle controller 30 samples the battery data periodically (for example, at intervals of 10 seconds), and transmits the sample to battery abnormality detection system 1 each time.

Vehicle controller 30 may store the battery data of electric vehicle 3 in an internal memory and collectively transmit the battery data stored in the memory at a predetermined timing. For example, vehicle controller 30 collectively transmits the battery data accumulated in the memory to a terminal device at the office after the business end of one day. The terminal device at the office collectively transmits the battery data of the plurality of electric vehicles 3 to battery abnormality detection system 1 at a predetermined timing.

Vehicle controller 30 may collectively transmit the battery data stored in the memory to charging adapter 6 or charger 4 having a network communication function via the charging cable at the time of charging from charger 4. Charging adapter 6 or charger 4 having a network communication function transmits the received battery data to battery abnormality detection system 1. This example is effective for electric vehicle 3 not equipped with a wireless communication function.

Figures 3, 4:
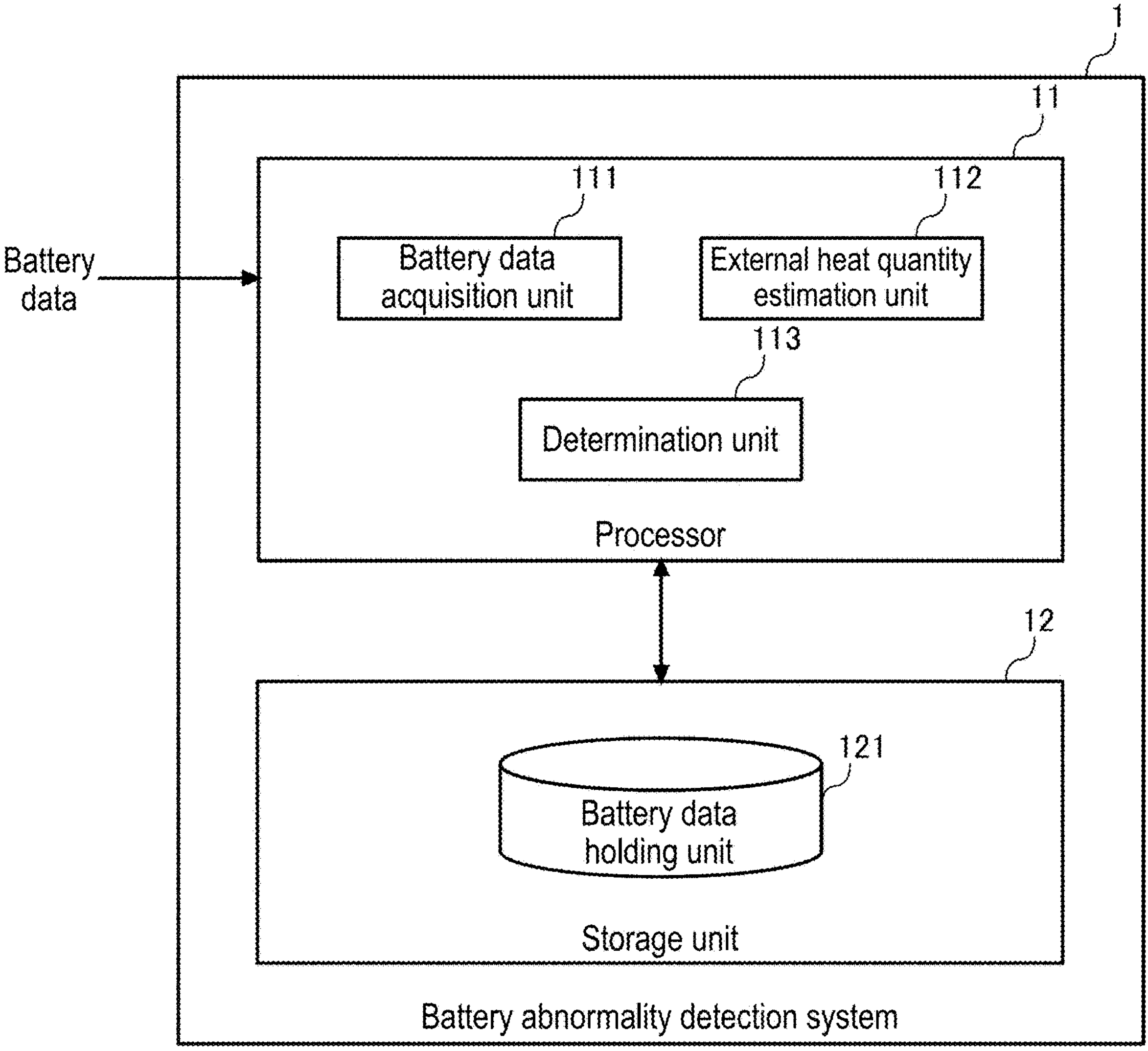
FIG. 3 is a diagram illustrating a configuration example of a battery abnormality detection system according to the exemplary embodiment.
FIG. 4 is a chart showing transition of a charging current flowing through a certain cell parallel cell block of a certain battery pack, and a maximum temperature and a minimum temperature observed in the battery pack.

FIG. 3 is a diagram illustrating a configuration example of battery abnormality detection system 1 according to the exemplary embodiment. Battery abnormality detection system 1 includes processor 11 and storage unit 12. Processor 11 includes battery data acquisition unit 111, external heat quantity estimation unit 112, and determination unit 113. The function of processor 11 can be achieved by cooperation of a hardware resource and a software resource, or by the hardware resource alone. The hardware resource may include a CPU, a ROM, a RAM, a graphics processing unit (GPU), an application specific integrated circuit (ASIC), a field programmable gate array (FPGA), and other LSI circuits. The software resource may be a program, such as an operating system (OS) or an application.

Storage unit 12 includes battery data holding unit 121. Storage unit 12 includes a nonvolatile recording medium such as a hard disk drive (HDD) and a solid state drive (SSD), and stores various data.

Battery data acquisition unit 111 acquires battery data from electric vehicle 3, the terminal device at the office, or the like, via network 2. Battery data acquisition unit 111 stores the acquired battery data in battery data holding unit 121.

Determination unit 113 reads the battery data of battery pack 41 as a target from battery data holding unit 121, and determines presence or absence of an abnormality of a specific cell or a specific parallel cell block in battery pack 41.

Here, a method of calculating a calorific value estimated from a charging current of a specific cell or a specific parallel cell block and a calorific value estimated from an observed temperature, and determining that there is an abnormality when the calorific value estimated from the observed temperature is larger than or equal to a threshold value is conceivable.

Calorific value Q estimated from charging current I flowing in the T period is obtained by the following expression.

$$Q = \int \left( I(t)^2 \cdot R \right) dt$$

Q: calorific value [J], I: current [A], R: internal resistance [Ω], T: elapsed time, t: observation time Calorific value Q estimated from the observed temperature is obtained by the following expression.

$$Q = C \cdot \Delta Temp$$

Q: calorific value [J], heat capacity C: [J/K], ΔTemp: temperature increased during T period [° C.] When the internal short-circuit occurs, the calorific value due to the short circuit current is added to the calorific value due to the charging current, and therefore the calorific value estimated from the observed temperature is larger than a calorific value when the internal short-circuit occurs. Therefore, when the calorific value estimated from the observed temperature is larger than the calorific value estimated from the charging current by a value larger than or equal to a threshold value, it can be estimated that the internal short-circuit has occurred.

However, the temperature rise caused by the external heat source is also added to the temperature ΔTemp rising in the T period. Since it is difficult to discriminate an amount of temperature rise caused by the external heat source from an amount of temperature rise caused by the internal short-circuit based on the amount of increase in the observed temperature, when the amount of temperature rise caused by the external heat source is large, accuracy of the determination on whether the internal short-circuit has occurred is reduced.

FIG. 4 is a chart showing transition of a charging current flowing through a certain cell parallel cell block of certain battery pack 41, and a maximum temperature and a minimum temperature observed in battery pack 41. In the example shown in FIG. 4, both the maximum temperature and the minimum temperature increase even after the charging is switched from constant current (CC) charging to constant charge (CV) charging. In this case, it is presumed that a cause of the temperature rise is not an internal short-circuit but a different external factor.

Hereinafter, a method for estimating an abnormality of a cell or a parallel cell block with high accuracy even when an influence of a heat quantity due to an external factor is large will be described. In the battery abnormality detection method described below, an influence of the heat quantity due to the external factor is canceled by relatively comparing temperature changes at a plurality of observation points measured by a plurality of temperature sensors in battery pack 41.

Figure 5:
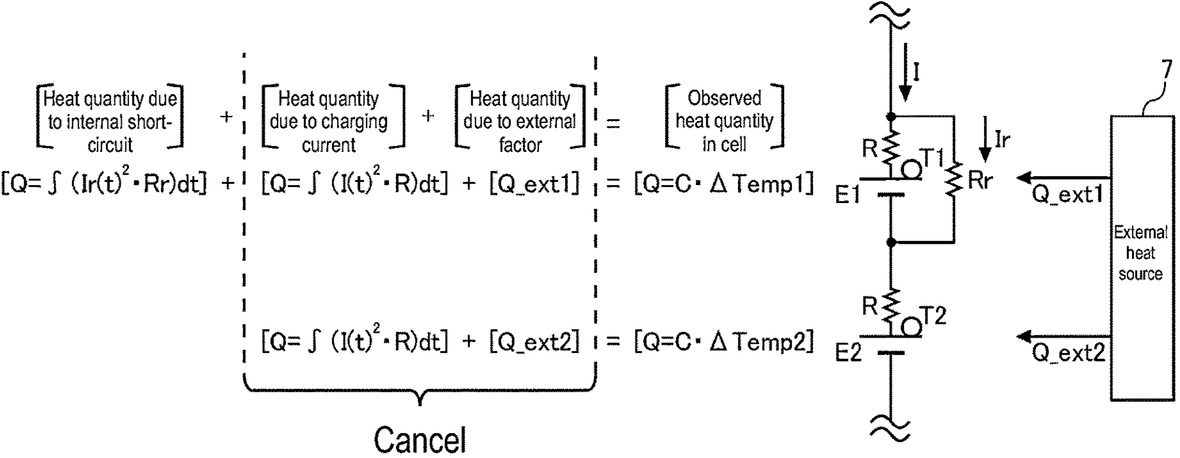
FIG. 5 is a diagram for explaining a basic concept of a battery abnormality detection method according to the exemplary embodiment.

FIG. 5 is a diagram for explaining a basic concept of the battery abnormality detection method according to the exemplary embodiment. It is assumed that battery pack 41 includes first cell E1 that is internally short-circuited and second cell E2 that is not internally short-circuited, first temperature sensor T1 is provided near first cell E1, and second temperature sensor T2 is provided near second cell E2.

Calorific value Q due to charging current I flowing in first cell E1 for the T period (for example, 10 minutes) is obtained by the following (expression 1).

$$Q = \int \left( I(t)^2 \cdot R \right) dt \qquad \text{(expression 1)}$$

Q: calorific value [J], I: current [A], R: internal resistance [Ω] of first cell E1, T: elapsed time, t: observation time Similarly, calorific value Q due to charging current I flowing in second cell E2 for the T period is obtained by the following (expression 1').

$$Q=\int\left(I(t)^2\cdot R\right)dt \quad \text{(expression 1')}$$

Q: calorific value [J], I: charging current [A], R: internal resistance [Ω] of second cell E2, T: elapsed time, t: observation time In first cell E1, calorific value Q generated in the T period is obtained by the following (expression 2).

$$Q=C\cdot\Delta Temp1 \quad \text{(expression 2)}$$

Q: calorific value [J], C: heat capacity [J/K] of first cell E1, ΔTemp1: temperature [° C.] increased during the T period (calculated based on observed temperature measured by first temperature sensor T1)

Similarly, in second cell E2, calorific value Q generated in the T period is obtained by the following (expression 2').

$$Q=C\cdot\Delta Temp2 \quad \text{(expression 2')}$$

Q: calorific value [J], C: heat capacity [J/K] of second cell E2, ΔTemp2: temperature [° C.] increased during the T period (calculated based on observed temperature measured by second temperature sensor T2)

Heat capacities C of first cell E1 and second cell E2 may be set in advance from the performance of the battery or may be estimated from actual use data.

Heat quantity Q_ext1 is applied from external heat source 7 to first cell E1 during the T period. Heat quantity Q_ext2 is applied from external heat source 7 to second cell E2 during the T period.

Calorific value Q due to internal short-circuit current Ir flowing in first cell E1 during the T period is obtained by the following (expression 3).

$$Q=\int\left(I(t)^2\cdot R\right)dt \quad \text{(expression 3)}$$

Q: calorific value [J], Ir: internal short-circuit current [A], Rr: internal short-circuit resistance [Ω] of first cell E1, T: elapsed time, t: observation time Calorific value Q of first cell E1 based on rise temperature ΔTemp1 during the T period obtained in the above (expression 2) matches a sum of calorific value Q based on charging current I flowing through first cell E1 during the T period obtained in the above (expression 1), heat quantity Q_ext1 applied from external heat source 7 to first cell E1 during the T period, and calorific value Q due to internal short-circuit current Ir flowing through first cell E1 during the T period obtained in the above (expression 3).

Calorific value Q of second cell E2 based on rise temperature ΔTemp2 during the T period obtained in the above (expression 2') matches a sum of calorific value Q based on charging current I flowing through second cell E2 during the T period obtained in the above (expression 1') and heat quantity Q_ext2 applied from external heat source 7 to second cell E2 during the T period.

Since first cell E1 and second cell E2 are connected in series, charging current I can be regarded as the same. Since the same type of battery is used for first cell E1 and second cell E2, internal resistances R of first cell E1 and second cell E2 can be regarded as the same. In that case, calorific value Q based on charging current I flowing through first cell E1 during the T period obtained in the above (expression 1) and calorific value Q based on charging current I flowing through second cell E2 during the T period obtained in the above (expression 1') are the same, and can be cancelled.

Given that heat quantity Q_ext1 applied from external heat source 7 to first cell E1 in the T period and heat quantity Q_ext2 applied from external heat source 7 to second cell E2 in the T period are uniform, the influence of the heat quantity due to the external factor can be cancelled.

From the above, a relationship of (expression 3)=(expression 2)−(expression 2') is established.

$$\int\left(Ir(t)^2\cdot Rr\right)dt=C\cdot\left(\Delta Temp1-\Delta Temp2\right)$$

Since internal short-circuit current IR is obtained by (voltage V1 of first cell E1/internal short-circuit resistance Rr of first cell E1), the above expression can be developed as the following (expression 4).

$$Rr=\left(\int V1(t)^2dt\right)/\left(C\cdot\left(\Delta Temp1-\Delta Temp2\right)\right) \quad \text{(expression 4)}$$

As described above, determination unit 113 can estimate an internal short-circuit resistance value of the specific cell or the specific parallel cell block, on the basis of the transition of the voltage of the specific cell or the specific parallel cell block in the T period in battery pack 41 (specifically, an integrated value of the square of the voltage in the T period) and the calorific value according to a difference between the rise temperature of the first observation point and the rise temperature of the second observation point in the T period in battery pack 41.

Determination unit 113 determines whether or not an internal short-circuit has occurred in a specific cell or a specific parallel cell block by comparing the estimated internal short-circuit resistance value with a threshold. The threshold value is set to a minimum allowable insulation resistance value. The threshold value is set on the basis of a catalog specification of the battery, an experimental result, a simulation result, and the like. When the estimated internal short-circuit resistance value is below the threshold, determination unit 113 determines that an internal short-circuit has occurred in a specific cell or a specific parallel cell block.

As the simplest processing, determination unit 113 may set the maximum temperature measured in battery pack 41 as the temperature at the first observation point, set the minimum temperature measured in battery pack 41 as the temperature at the second observation point, and obtain a difference (ΔTemp1−ΔTemp2) between the rise temperatures of the first observation point and the second observation point.

As the most elaborate processing, determination unit 113 may obtain differences (ΔTemp1−ΔTemp2) between the rise temperatures for all combinations of arbitrary two observation points among the plurality of observation points in battery pack 41.

Determination unit 113 may estimate the internal short-circuit resistance value of all the cells or all the parallel cell blocks of the plurality of cells or the plurality of parallel cell blocks in battery pack 41. In addition, determination unit 113 may estimate only the internal short-circuit resistance value of a predetermined number of cells or parallel cell blocks close to the observation point of the maximum temperature in battery pack 41.

As the number of temperature sensors provided in battery pack 41 increases, a range in which a cell or a parallel cell block where the internal short-circuit occurs is present can be narrowed down.

Figure 6:
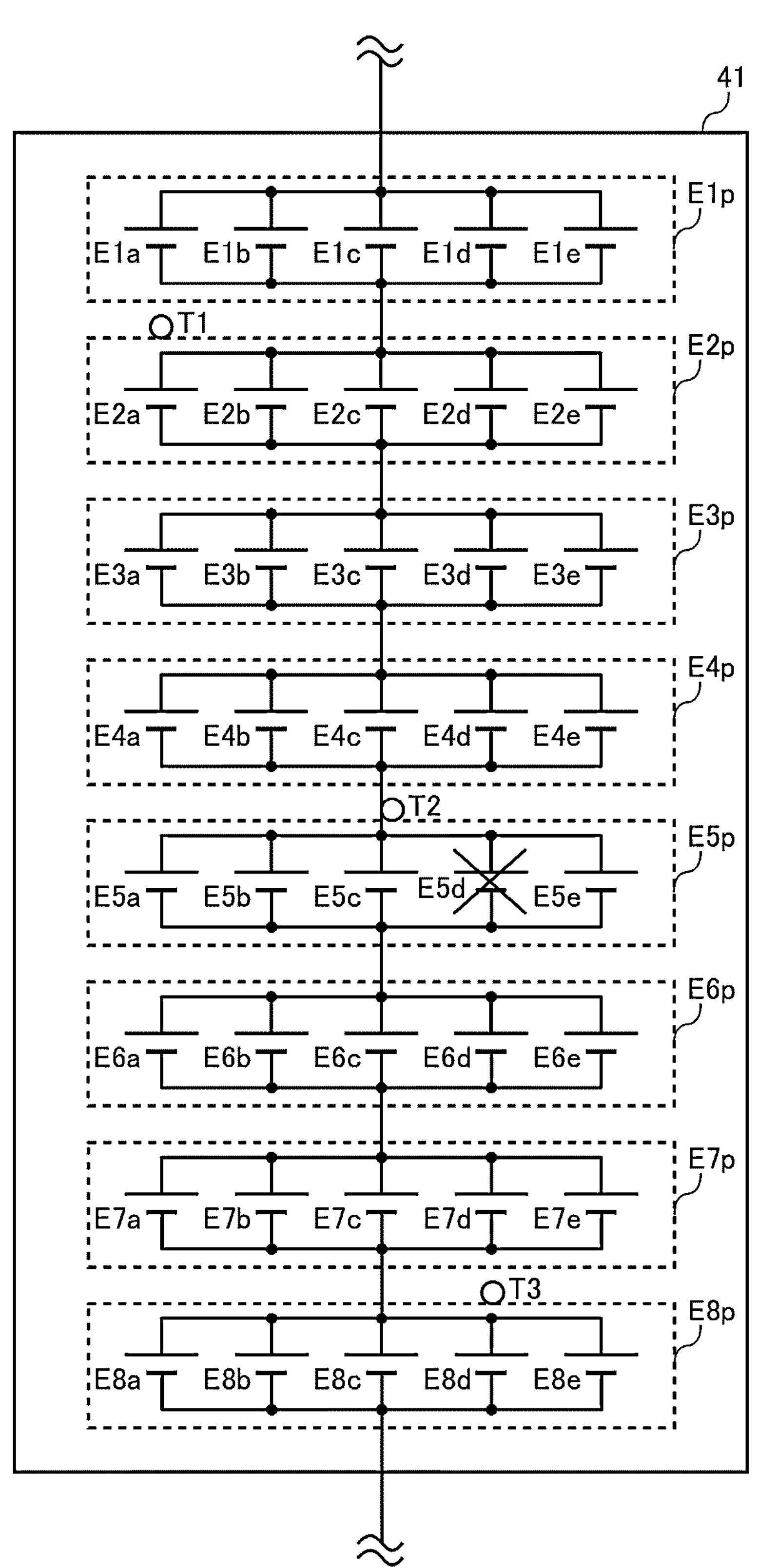
FIG. 6 is a diagram illustrating a connection example of cells in a battery pack and an arrangement example of temperature sensors.

FIG. 6 is a diagram illustrating a connection example of cells in battery pack 41 and an arrangement example of temperature sensors. In the example illustrated in FIG. 6, eight parallel cell blocks in which five cells are connected in parallel are connected in series. Three temperature sensors are provided in battery pack 41. Specifically, first temperature sensor T1 is provided between 1.1st cell E1*a* of first parallel cell block E1*p* and 2.1st cell E2*a* of second parallel cell block E2*p*, second temperature sensor T2 is provided between 4.3rd cell E4*c* of fourth parallel cell block E4*p* and 5.3rd cell E5*c* of fifth parallel cell block E5*p*, and third temperature sensor T3 is provided between 7.4th cell E7*d* of seventh parallel cell block E7*p* and 8.4th cell E8*d* of eighth parallel cell block E8*p*.

Figure 7:
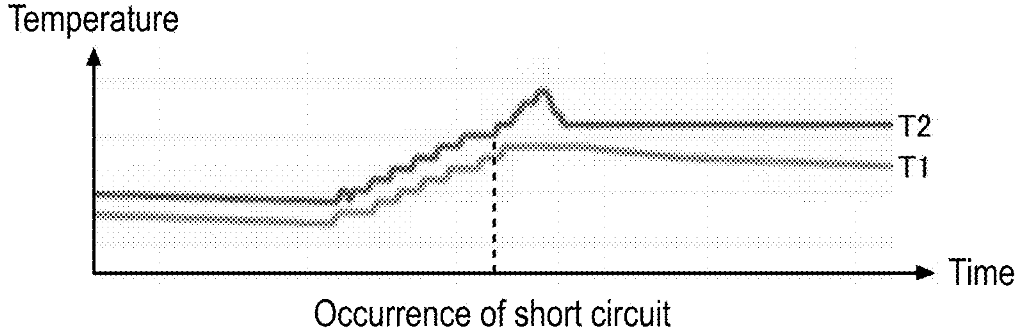
FIG. 7 is a chart showing a transition example of a temperature measured by a first temperature sensor and a temperature measured by a second temperature sensor provided in the battery pack illustrated in FIG. 6.

FIG. 7 shows a transition example of a temperature measured by first temperature sensor T1 and a temperature measured by second temperature sensor T2 provided in battery pack 41 illustrated in FIG. 6. FIGS. 6 and 7 illustrate an example in which an internal short-circuit occurs in 5.4th cell E5*d* of fifth parallel cell block E5*p*. Before the occurrence of the internal short-circuit, the temperature measured by first temperature sensor T1 and the temperature measured by second temperature sensor T2 increase in parallel with the flow of the current through the plurality of parallel cell blocks E1*p* to E8*p*. On the other hand, after the occurrence of the internal short-circuit, an increase in the temperature measured by second temperature sensor T2 is larger. After the current stops, the temperature measured by first temperature sensor T1 decreases, but the temperature measured by second temperature sensor T2 remains to be high.

As described above, it can be seen that the temperature measured by second temperature sensor T2 provided at a position close to 5.4th cell E5*d* where the internal short-circuit has occurred has a larger temperature rise width than the temperature measured by first temperature sensor T1 provided at a position far from 5.4th cell E5*d* where the internal short-circuit has occurred.

In the above (expression 4), since current I disappears from the parameter, determination unit 113 can determine presence or absence of an abnormality of a specific cell or a specific parallel cell block in battery pack 41 even during the suspension of battery pack 41. In principle, it is possible to determine the presence or absence of an abnormality of a specific cell or a specific parallel cell block in battery pack 41 even during discharge of battery pack 41. However, during discharging, an influence of heat generation of a load (motor 34) (heat generation due to an external factor) increases, and thus determination accuracy decreases.

The description returns to FIG. 3. External heat quantity estimation unit 112 estimates a heat quantity due to an external factor of battery pack 41, the heat quantity being applied to each of the first observation point and the second observation point in battery pack 41. For example, in battery pack 41, a map or a function defining a relationship between a heat quantity to be applied to each of a plurality of observation points where a plurality of temperature sensors is provided and an external condition is obtained in advance by experiment or simulation, and is registered in storage unit 12.

The heat quantity due to external factors of battery pack 41 also includes a negative heat quantity that lowers the temperature of the cell. In this case, a temperature decrease caused by an external cooling source (for example, a cooler or a fan) is also added to temperature ΔTemp rising in the T period. That is, in the T period, heat quantity Q_ext1 is dissipated from first cell E1 to the outside, and heat quantity Q_ext2 is dissipated from second cell E2 to the outside. In other words, in the T period, a negative heat quantity (−Q_ext1) from outside is applied to first cell E1, and a negative heat quantity (−Q_ext2) from outside is applied to second cell E2.

As the external condition, a temperature measured by a temperature sensor (not illustrated) provided outside battery pack 41 can be used. For example, at least one of a temperature of motor 34 measured by a temperature sensor (not illustrated) provided in the vicinity of motor 34, a temperature measured by a temperature sensor (not illustrated) provided in the vicinity of a heater (not illustrated) for warming battery pack 41, a temperature measured by a temperature sensor (not illustrated) provided in the vicinity of a cooler or a fan for cooling battery pack 41, and an outside air temperature measured by an outside air temperature sensor (not illustrated) can be used. Further, a vehicle speed, a rotation speed of motor 34, and the like can also be used as the external condition.

For example, a heat quantity per unit time applied to each of a plurality of observation points in battery pack 41 may be obtained by thermal conduction simulation for each of a plurality of sections of the temperature of motor 34, and may be mapped. Battery management unit 42 acquires the temperature of motor 34 from vehicle controller 30 as measurement data of the external condition, and transmits the measurement data to battery abnormality detection system 1. External heat quantity estimation unit 112 estimates heat quantity Q_ext applied from external heat source 7 (including the cooling source) to each observation point of battery pack 41 based on the acquired temperature of motor 34 and the map. Determination unit 113 can individually remove the influence of heat quantity Q_ext1 applied to the first observation point and heat quantity Q_ext2 applied to the second observation point from the rise temperature of the first observation point and the rise temperature of the second observation point. That is, determination unit 113 can obtain internal short-circuit resistance Rr with higher accuracy from a relationship of (expression 3)=(expression 2)−(expression 2')−Q_ext1+Q_ext2.

The map or the function that defines the relationship between the heat quantity to be applied to each of the plurality of observation points in battery pack 41 and the external condition may be generated by learning actual data measured after the start of use of electric vehicle 3, instead of being generated on the basis of a preliminary experiment or simulation.

As described above, according to the present exemplary embodiment, the presence or absence of an abnormality of a cell or a parallel cell block is determined based on the internal short-circuit resistance of the cell or the parallel cell block in battery pack 41 estimated from the relative temperature change of the plurality of observation points in battery pack 41. This makes it possible to distinguish between a temperature rise due to an abnormality of the cell or the parallel cell block and a temperature rise due to external heat source 7, and detect the abnormality of the cell or the parallel cell block with high accuracy. Since the presence or absence of an abnormality is determined based on the relative comparison between the rise temperatures at the plurality of observation points, the detection accuracy can be maintained even when the heat quantity applied from external heat source 7 greatly changes due to the environmental change of external heat source 7 (for example, failure of the heater).

In general, since the plurality of temperature sensors are mounted in battery pack 41, an additional cost of hardware is basically not generated. In addition, since the determination is made based on the voltage of the cell or the parallel cell block and the plurality of observed temperatures in battery pack 41 without depending on the current of the cell or the parallel cell block, it is possible to detect an anomaly not only during charging but also during rest or discharging. Further, by utilizing the measurement data of the external condition, it is possible to determine the presence or absence of an abnormality of the cell or the parallel cell block in battery pack 41 with higher accuracy. Even when some of cells or parallel cell blocks in battery pack 41 are grounded, an abnormality can be detected.

The present disclosure has been described in the foregoing based on the exemplary embodiment. It is to be understood by the person of ordinary skill in the art that the exemplary embodiment is an example, that combinations of its configuration elements and processing processes can have various modified examples, and that such modified examples are also within the scope of the present disclosure.

In the above exemplary embodiment, the example has been described in which an abnormality of the cell or the parallel cell block in battery pack 41 mounted on electric vehicle 3 is detected by battery abnormality detection system 1 connected to network 2. In this respect, battery abnormality detection system 1 may be incorporated in battery controller 46. Battery abnormality detection system 1 may be incorporated in charger 4 or charging adapter 6.

Battery abnormality detection system 1 according to the present disclosure is not limited to the abnormality detection of the cell or the parallel cell block in battery pack 41 mounted on electric vehicle 3. For example, the present invention is also applicable to abnormality detection of a cell or a parallel cell block in a battery pack mounted on an electric ship, a multi-copter (drone), an electric motorcycle, an electric bicycle, a stationary power storage system, a smartphone, a tablet, a notebook PC, or the like. For example, when used for abnormality detection of a cell or a parallel cell block in a battery pack mounted on a smartphone, a tablet, a notebook PC, or the like, the temperature of the CPU may be used as measurement data of an external condition.

The exemplary embodiment may be specified by the following items.

[Item 1] A battery abnormality detection system (1) including:

an acquisition unit (111) that acquires voltages of one of a plurality of cells (E1 to En) and a plurality of parallel cell blocks (E1*p* to Enp) in a battery pack (41) and temperatures at a plurality of observation points respectively measured by a plurality of temperature sensors (T1 to T3) provided in the battery pack (41); and a determination unit (113) that determines presence or absence of an abnormality in one of a specific cell (E1) and a specific parallel cell block (E1*p*), based on a transition of a voltage of the one of the specific cell (E1) and the specific parallel cell block (E1*p*) in a predetermined period in the battery pack (41) and on a difference between a temperature change at a first observation point and a temperature change at a second observation point in the predetermined period in the battery pack (41).

According to this, the abnormality of the specific cell (E1) or the specific parallel cell block (E1*p*) can be detected with high accuracy.

[Item 2] The battery abnormality detection system (1) according to item 1, in which the determination unit (113) determines whether an internal short-circuit has occurred in the one of the specific cell (E1) and the specific parallel cell block (E1*p*) by estimating an internal short-circuit resistance value of the one of the specific cell (E1) and the specific parallel cell block E1*p*) based on an integrated value of squares of voltages of the one of the specific cell (E1) and the specific parallel cell block (E1*p*) in the predetermined period in the battery pack (41) and on a calorific value corresponding to a difference between a rise temperature at a first observation point and a rise temperature at a second observation point in the predetermined period in the battery pack (41).

According to this, the internal short-circuit of the specific cell (E1) or the specific parallel cell block (E1*p*) can be detected with high accuracy.

[Item 3] The battery abnormality detection system (1) according to item 1 or 2, in which the temperature at the first observation point is a maximum temperature among the plurality of temperatures measured by the plurality of temperature sensors (T1 to T3) provided in the battery pack (41), and the temperature at the second observation point is a minimum temperature among the plurality of temperatures measured by the plurality of temperature sensors (T1 to T3) provided in the battery pack (41).

According to this, the abnormality detection process can be simplified.

[Item 4] The battery abnormality detection system (1) according to any one of items 1 to 3, further including:

an external heat quantity estimation unit (112) that estimates a heat quantity due to an external factor external to the battery pack (41), the heat quantity being applied to each of the first observation point and the second observation point, respectively, in which the external heat quantity estimation unit (112) estimates the heat quantity to be applied to each of the first observation point and the second observation point based on one of a map and a function defining a relationship between a heat quantity to be applied to each of a plurality of observation points in the battery pack (41) and an external condition and on measurement data of the external condition, and the determination unit (113) removes an influence of the heat quantity due to the external factor individually from the temperature change at the first observation point and the temperature change at the second observation point.

According to this, the abnormality of the specific cell (E1) or the specific parallel cell block (E1*p*) can be detected with higher accuracy.

[Item 5] The battery abnormality detection system (1) according to any one of items 1 to 4, in which the determination unit (113) determines the presence or absence of the abnormality in the one of the specific cell (E1) and the specific parallel cell block (E1*p*) while the battery pack (41) is charged or non-operational.

According to this, as an abnormality is detected in a state where a change in an external environment due to a load variation is small, the detection accuracy can be improved.

[Item 6] A battery abnormality detection method including:

acquiring voltages of one of a plurality of cells (E1 to En) and a plurality of parallel cell blocks (Ep1 to Epn) in a battery pack (41) and temperatures at a plurality of observation points respectively measured by a plurality of temperature sensors (T1 to T3) provided in the battery pack (41); and determining presence or absence of an abnormality in one of a specific cell (E1) and a specific parallel cell block (E1*p*), based on a transition of a voltage of the one of the specific cell (E1) and the specific parallel cell block (E1*p*) in a predetermined period in the battery pack (41) and on a difference between a temperature change at a first observation point and a temperature change at a second observation point in the predetermined period in the battery pack (41).

According to this, the abnormality of the specific cell (E1) or the specific parallel cell block (E1*p*) can be detected with high accuracy.

[Item 7] A battery abnormality detection program causing a computer to execute the processes of:

acquiring voltages of one of a plurality of cells (E1 to En) and a plurality of parallel cell blocks (Ep1 to Epn) in a battery pack (41) and temperatures at a plurality of observation points respectively measured by a plurality of temperature sensors (T1 to T3) provided in the battery pack (41); and determining presence or absence of an abnormality in one of a specific cell (E1) and a specific parallel cell block (E1*p*), based on a transition of a voltage of the one of the specific cell (E1) and the specific parallel cell block (E1*p*) in a predetermined period in the battery pack (41) and on a difference between a temperature change at a first observation point and a temperature change at a second observation point in the predetermined period in the battery pack (41).

According to this, the abnormality of the specific cell (E1) or the specific parallel cell block (E1*p*) can be detected with high accuracy.

REFERENCE MARKS IN THE DRAWINGS

1: battery abnormality detection system
2: network
3: electric vehicle
4: charger
5: commercial power system
6: charging adapter
7: external heat source
11: processor
111: battery data acquisition unit
112: external heat quantity estimation unit
113: determination unit
12: storage unit
121: battery data holding unit
30: vehicle controller
34: motor
35: inverter
36: wireless communication unit
36*a*: antenna
40: power supply system
41: battery pack
42: battery management unit
43: voltage measurement unit
44: temperature measurement unit
45: current measurement unit
46: battery controller
E1-En: cell
E1*p*-Enp: parallel cell block
RY1-RY2: relay
T1-T3: temperature sensor
Rs: shunt resistor

The invention claimed is:

1. A battery abnormality detection system comprising:

an acquisition unit that acquires voltage of each of a plurality of cells or a plurality of parallel cell blocks in a battery pack and temperatures at a plurality of observation points respectively measured by a plurality of temperature sensors provided in the battery pack; and a determination unit that determines whether a specific cell or a specific parallel cell block is an abnormality, based on a transition of a voltage of the each of the specific cell or the specific parallel cell block in a predetermined period in the battery pack and on a difference between a temperature change at a first observation point and a temperature change at a second observation point in the predetermined period in the battery pack, wherein the determination unit determines whether an internal short-circuit is in the specific cell or the specific parallel cell block by estimating an internal short-circuit resistance value of the specific cell or the specific parallel cell block based on an integrated value of squares of voltages of the specific cell or the specific parallel cell block in the predetermined period in the battery pack and on a calorific value corresponding to a difference between a rise temperature at a first observation point and a rise temperature at a second observation point in the predetermined period in the battery pack.

2. The battery abnormality detection system according to claim 1, wherein the temperature at the first observation point is a maximum temperature among the plurality of temperatures measured by the plurality of temperature sensors provided in the battery pack, and the temperature at the second observation point is a minimum temperature among the plurality of temperatures measured by the plurality of temperature sensors provided in the battery pack.

3. The battery abnormality detection system according to claim 1, further comprising an external heat quantity estimation unit that estimates a heat quantity due to an external factor external to the battery pack, the heat quantity being applied to each of the first observation point and the second observation point, respectively, wherein the external heat quantity estimation unit estimates the heat quantity to be applied to each of the first observation point and the second observation point based on one of a map and a function defining a relationship between a heat quantity to be applied to each of a plurality of observation points in the battery pack and an external condition and on measurement data of the external condition, and the determination unit removes an influence of the heat quantity due to the external factor individually from the temperature change at the first observation point and the temperature change at the second observation point.

4. The battery abnormality detection system according to claim 1, wherein the determination unit determines whether the specific cell or the specific parallel cell block is an abnormality while the battery pack is charged or non-operational.

5. A battery abnormality detection method comprising:

acquiring voltage of each of a plurality of cells or a plurality of parallel cell blocks in a battery pack and temperatures at a plurality of observation points respectively measured by a plurality of temperature sensors provided in the battery pack; and determining whether a specific cell or a specific parallel cell block is an abnormality, based on a transition of a voltage of the specific cell or the specific parallel cell block in a predetermined period in the battery pack and on a difference between a temperature change at a first observation point and a temperature change at a second observation point in the predetermined period in the battery pack, wherein the determining comprises determining whether an internal short-circuit is in the specific cell or the specific parallel cell block by estimating an internal short-circuit resistance value of the specific cell or the specific parallel cell block based on an integrated value of squares of voltages of the specific cell or the specific parallel cell block in the predetermined period in the battery pack and on a calorific value corresponding to a difference between a rise temperature at a first observation point and a rise temperature at a second observation point in the predetermined period in the battery pack.

6. A non-transitory storage medium storing thereon a program designed to cause one or more processors to perform operations comprising:

acquiring voltage of each of a plurality of cells or a plurality of parallel cell blocks in a battery pack and temperatures at a plurality of observation points respectively measured by a plurality of temperature sensors provided in the battery pack; and determining whether a specific cell or a specific parallel cell block is an abnormality, based on a transition of a voltage of the specific cell or the specific parallel cell block in a predetermined period in the battery pack and on a difference between a temperature change at a first observation point and a temperature change at a second observation point in the predetermined period in the battery pack, wherein the determining comprises determining whether an internal short-circuit is in the specific cell or the specific parallel cell block by estimating an internal short-circuit resistance value of the specific cell or the specific parallel cell block based on an integrated value of squares of voltages of the specific cell or the specific parallel cell block in the predetermined period in the battery pack and on a calorific value corresponding to a difference between a rise temperature at a first observation point and a rise temperature at a second observation point in the predetermined period in the battery pack.

* * * * *